United States Patent
Shibahara et al.

(10) Patent No.: US 10,479,732 B2
(45) Date of Patent: Nov. 19, 2019

(54) OXYNITRIDE THIN FILM AND CAPACITANCE ELEMENT

(71) Applicant: TDK CORPORATION, Tokyo (JP)

(72) Inventors: Takeshi Shibahara, Tokyo (JP); Yuki Nagamine, Tokyo (JP); Kumiko Yamazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/938,344

(22) Filed: Mar. 28, 2018

(65) Prior Publication Data

US 2018/0282228 A1   Oct. 4, 2018

(30) Foreign Application Priority Data

Mar. 31, 2017 (JP) ................. 2017-071128
Jan. 30, 2018 (JP) ................. 2018-013705

(51) Int. Cl.
*C04B 35/58* (2006.01)
*H01L 49/02* (2006.01)
(Continued)

(52) U.S. Cl.
CPC .... *C04B 35/58007* (2013.01); *C04B 35/6262* (2013.01); *C04B 35/6264* (2013.01);
(Continued)

(58) Field of Classification Search
CPC . C04B 35/58007; C04B 35/495; C04B 35/46; C04B 35/62655; C04B 35/64;
(Continued)

(56) References Cited

U.S. PATENT DOCUMENTS

| | | | |
|---|---|---|---|
| 4,734,390 A | 3/1988 | Marchand et al. | |
| 6,878,666 B2* | 4/2005 | Donnen | B01J 23/02 501/96.1 |

(Continued)

FOREIGN PATENT DOCUMENTS

| | | |
|---|---|---|
| CN | 102482115 A | 5/2012 |
| JP | S61-122108 A | 6/1986 |

(Continued)

OTHER PUBLICATIONS

Kawashima et al. Chloride Flux Growth of La2TiO5 Crystals and Nontopotactic Solid State Transformation to LaTiO2N Crystals by Nitridation Using NH3 . Cryst. Growth Des. 2015, 15, 333-339.*

(Continued)

*Primary Examiner* — Noah S Wiese
(74) *Attorney, Agent, or Firm* — Oliff PLC (57) ABSTRACT

A dielectric thin film has a main component including an oxynitride having excellent dielectric property, and a capacitance element includes the dielectric thin film. The dielectric thin film has a main component made of an oxynitride expressed by a compositional formula of $A_a B_b O_o N_n$ (a+b+o+n=5), wherein "A" is one or more selected from Sr, Ba, Ca, La, Ce, Pr, Nd, and Na, "B" is one or more selected from Ta, Nb, Ti, and W, and crystalline particles constituting the dielectric thin film are polycrystalline which are not oriented to a particular crystal plane orientation, and further the crystalline particles have columnar shape crystals.

5 Claims, 2 Drawing Sheets

(51) Int. Cl.
*H01B 3/10* (2006.01)
*C04B 35/626* (2006.01)
*C04B 35/64* (2006.01)
*C04B 35/622* (2006.01)
*C04B 35/634* (2006.01)

(52) U.S. Cl.
CPC .. *C04B 35/62218* (2013.01); *C04B 35/62655* (2013.01); *C04B 35/63416* (2013.01); *C04B 35/64* (2013.01); *H01B 3/10* (2013.01); *H01L 28/55* (2013.01); *C04B 2235/3886* (2013.01); *C04B 2235/602* (2013.01); *C04B 2235/612* (2013.01); *C04B 2235/656* (2013.01); *C04B 2235/768* (2013.01)

(58) Field of Classification Search
CPC .......... C04B 35/63416; C04B 35/6262; C04B 35/6264; C04B 35/62218; C04B 2235/768; C04B 2235/3886; C04B 2235/602; C04B 2235/612; C04B 2235/656; H01G 4/33; H01G 4/085; H01G 4/1218; H01G 4/1272; H01L 28/55
See application file for complete search history.

(56) References Cited

U.S. PATENT DOCUMENTS

2002/0151434 A1* 10/2002 Donnen ................. B01J 23/02
  502/200
2004/0259380 A1  12/2004 Fukuda et al.
2005/0227859 A1* 10/2005 Nakabayashi ......... B01J 21/063
  502/150
2008/0286643 A1* 11/2008 Iwasaki ................. B01D 53/326
  429/111
2009/0311879 A1  12/2009 Blasco et al.
2011/0090006 A1*  4/2011 Yamazaki ............. H04M 1/0266
  327/581
2012/0224297 A1   9/2012 Sakurai et al.

FOREIGN PATENT DOCUMENTS

JP    2004-296603 A    10/2004
JP    2013-001625 A     1/2013

OTHER PUBLICATIONS

Kato, Kazumi, "Surface morphology and dielectric properties of alkoxy-derived Sr2Ta2O7 and Sr2(Ta,Nb)2O7 thin films.", Journal of Materials Science: Materials in Electronics, vol. 11, pp. 575-578, (2000).
Hirose, Yasushi et al., "Epitaxial Growth of Perovskite Oxynitride CaTaO2N thin Film.", KAST Year 2013 Research Outline, pp. 32-33.
Oka, Daichi et al., "Possible ferroelectricity in perovskite oxynitride SrTaO2N epitaxial thin films.", Scientific Reports 4. DOI: 10.1038/srep04987, pp. 1-6.
Kim, Young-Il et al., "Characterization of the Structural, Optical, and Dielectric Properties of Oxynitride Perovskites AMO2N (A=Ba, Sr, Ca; M=Ta, Nb).", American Chemical Society, Chem. Mater., vol. 16, No. 7, pp. 1267-1276, (2004).

* cited by examiner

OXYNITRIDE THIN FILM AND CAPACITANCE ELEMENT

BACKGROUND OF THE INVENTION

1. Field of the Invention

The present invention relates to a dielectric thin film having a main component made of an oxynitride, and a capacitance including the dielectric thin film.

2. Description of the Related Art

As digital devices have been down sized and have attained higher performances in recent years, the capacitance element using a high performance dielectric thin film is demanded.

Conventionally, a thin film using metal oxide material has been widely used as the dielectric thin film. However, the improvement of the property of the dielectric thin film made by the metal oxide material is reaching its limits, and new material having higher property is demanded.

As the material of the dielectric thin film, oxynitride may be mentioned. Oxynitride can be expressed by $ABO_2N$, and for example, as oxynitride expressed by a compositional formula of $SrTaO_2N$, an oxide as a precursor thereof is $Sr_2Ta_2O_7$. $SrTaO_2N$ can be directly formed by a compound including Sr, Ta, O, and N, and it can also be obtained by nitriding $Sr_2Ta_2O_7$. A dielectric constant of $Sr_2Ta_2O_7$ differs depending on a production method, and it is usually around 100 (Non-patent document 1). On the other hand, as the dielectric constant of $SrTaO_2N$, a value of several thousand or more has been reported (Non-patent document 2, Patent document 1). That is, the dielectric constant dramatically increases by taking nitrogen into a crystal lattice of oxynitride.

Among such oxynitride, as one of the proposed new materials, a metal oxynitride material may be mentioned wherein part of oxygen atoms in oxygen-octahedron structure of perovskite type crystal structure are substituted with nitrogen atoms. However, the dielectric thin film having the metal oxynitride material is difficult to obtain.

For example, the patent document 2 and the patent document 3 disclose the method of producing a powder of perovskite type oxynitride $ABO_2N$. However, the patent document 2 and the patent document 3 do not disclose of obtaining the thin film using the perovskite type oxynitride $ABO_2N$.

Also, the non-patent document 3 and the non-patent document 4 disclose that the thin film was produced of the perovskite type oxynitride $ABO_2N$. However, the thin film obtained in the non-patent document 3 and the non-patent document 4 is an epitaxial film.

The epitaxial film has a disadvantage that it takes extremely long time to produce. The non-patent document 3 discloses that the production of the epitaxial film having a thickness of 200 nm or less took 530 hours or less, which is a long time.

[Patent document 1] JP Patent Application Laid Open No. 2004-296603
[Patent document 2] JP Patent Application Laid Open No. S61-122108
[Patent document 3] JP Patent Application Laid Open No. 2013-001625
[Non-patent document 1] Journal of Materials Science: Materials in Electronics, 11 (2000), p. 575-578
[Non-patent document 2] Chem. Master., Vol. 16, No. 7, 2004, p. 1267-1276
[Non-patent document 3] Scientific Reports 4. DOI: 10.1038/srep04987
[Non-patent document 4] KAST Year 2013 Research outline p. 32-33

SUMMARY OF THE INVENTION

The present invention is attained in view of such circumstances, and the object is to provide the dielectric thin film having a main component made of oxynitride having high production efficiency and excellent dielectric property, and the capacitance element including the dielectric thin film.

The dielectric thin film according to the present invention is a dielectric thin film comprising a main component comprised of an oxynitride expressed by a compositional formula of $A_a B_b O_o N_n$ (a+b+o+n=5), wherein
said "A" is one or more selected from the group consisting of Sr, Ba, Ca, La, Ce, Pr, Nd, and Na,
said "B" is one or more selected from the group consisting of Ta, Nb, Ti, and W, and
crystalline particles constituting said dielectric thin film are polycrystallines which are not oriented to a particular crystal plane orientation, and further the crystalline particles comprises columnar shape crystals.

The dielectric thin film according to the present invention has the above mentioned characteristics, and thereby the dielectric property can be enhanced.

Preferably, said columnar shape crystals extend to a direction crossing with a substrate of which said dielectric thin film is formed.

Preferably, a constituting ratio of said columnar shape crystals penetrating from a surface to a rear face of said dielectric thin film are 30% or more.

Preferably, a fluctuation rate calculated from compositional ratios of nitrogen at a position of ¼ of depth, ½ of depth, and ¾ of depth from the surface of said dielectric thin film in a thickness direction are within maximum of +55%.

Preferably, said "A" is Sr, said "B" is Ta and/or Nb, and said "n" is larger than 0 and smaller than 1.

The capacitance element according to the present invention includes the dielectric thin film.

DESCRIPTION OF THE PREFERRED EMBODIMENTS

Hereinafter, the present invention will be explained by referring to embodiments.

Figure 1:
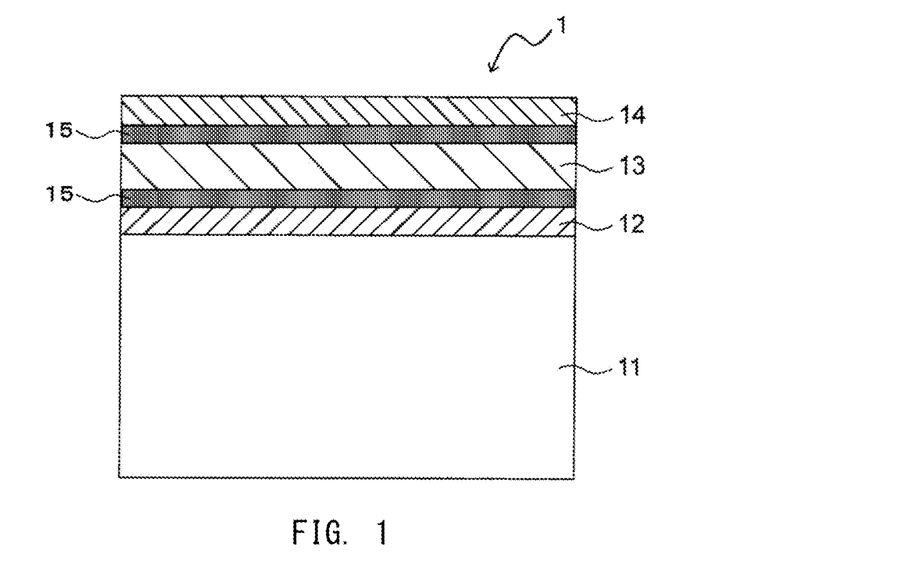
FIG. 1 is a schematic diagram of a thin film capacitor according to one embodiment of the present invention.

FIG. 1 shows the schematic diagram of the thin film capacitor (the capacitance element) according to the present embodiment. In the thin film capacitor 1 shown in FIG. 1, a lower electrode 12 and a dielectric thin film 13 are formed in this order on a substrate 11, and an upper electrode 14 is on the dielectric thin film 13.

The material of the substrate 11 is not particularly limited, but Si single crystal substrate is used as the substrate 11 because of the cost and because it is easy to obtain. In case flexibility is important, Ni foil can be used as the substrate.

The material of the lower electrode 12 and the upper electrode 14 are not particularly limited as long as these function as the electrode. For example, Pt, Ag, and Ni or so may be mentioned. The thickness of the lower electrode 12 is preferably 0.01 to 10 μm. The thickness of the upper electrode 14 is preferably 0.01 to 10 μm.

The dielectric thin film 13 has the main component made of oxynitride expressed by the compositional formula of $A_aB_bO_oN_n$ (a+b+o+n=5).

"A" is one or more elements selected from the group consisting of Sr, Ba, Ca, La, Ce, Pr, Nd and Na. Preferably, "A" is one or more elements selected from the group consisting of Sr, Ba, La, and Nd. More preferably, "A" is Sr. By using the above mentioned elements as "A", a high capacitance can be obtained. "B" is one or more element selected from the group consisting of Ta, Nb, Ti, and W. Preferably, "B" is one or more elements selected from the group consisting of Ta and Nb. More preferably, "B" is Ta. By using the above mentioned elements as "B", the dielectric thin film 13 with little secondary phase can be obtained.

Also, in the compositional formula $A_aB_bO_oN_n$, preferably a<1 is satisfied. Also, preferably, a/b>1 is satisfied, and more preferably a/b≥1.05 is satisfied. Also, preferably 1>n>0 is satisfied, more preferably 1>n≥0.3, and more preferably 1>n≥0.5 is satisfied. By having "a", "b", and "n" within the above mentioned range, a good dielectric property can be obtained.

Figure 2:
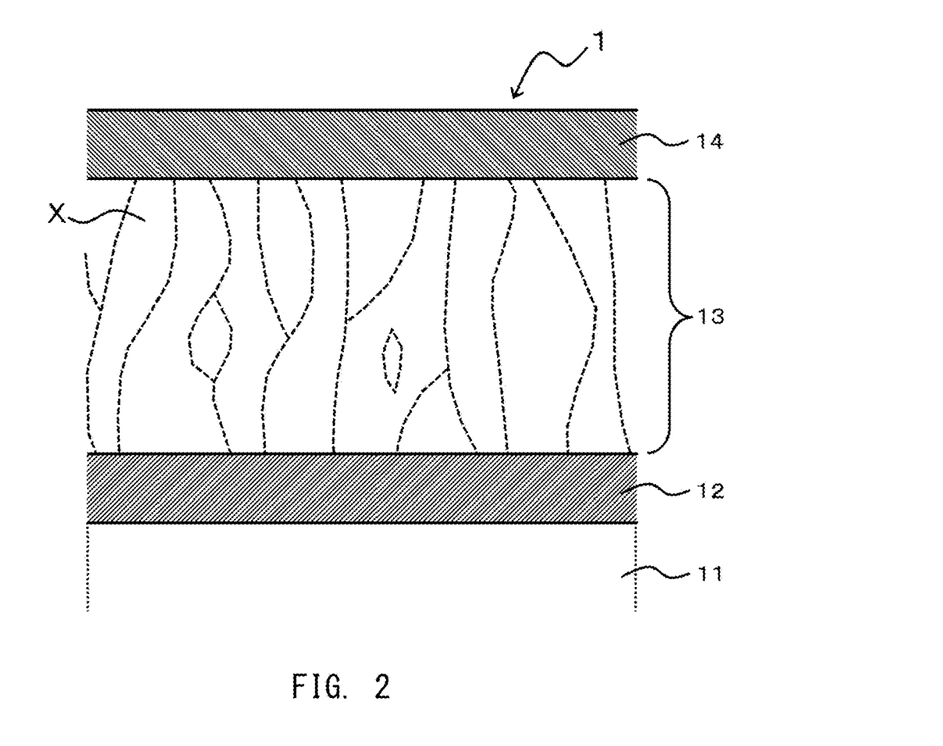
FIG. 2 is a schematic diagram of which a broken line shows a shape of the columnar shape crystal in the dielectric thin film according to one embodiment of the present invention.

The crystal particles constituting the dielectric thin film are polycrystalline which is not aligned to a specific crystal plane. Further, as shown in FIG. 2, the crystal particles constituting the dielectric thin film 13 are constituted by crystals X having columnar shape, and preferably the crystals X having columnar shape extends in a crossing direction with the substrate 11 of which the dielectric thin film 13 is formed. Also, as shown in FIG. 2, the crystals X having the columnar shape preferably penetrate through from the surface of the upper electrode 14 side to the substrate 11 side of the dielectric thin film 13. In the present embodiment, the crystal particle constituting the dielectric thin film 13 are polycrystalline which is not aligned with respect to a specific crystal plane; and as it is constituted by the crystal X having the columnar shape, the dielectric property is improved.

The crystal particles constituting the dielectric thin film 13 are polycrystalline which is not aligned to a specific crystal plane, and are constituted by the crystals X having the columnar shape, thus nitrogen is efficiently taken into the crystal particles, and the dielectric property of the dielectric thin film is thought to improve.

Usually, an alignment film is formed in a relatively slow film deposition speed in order to obtain an alignment thereof. However, in such a slow film deposition speed, a sufficient grain boundary in a film thickness direction which is a passage of nitrogen diffusion cannot be obtained. In the present embodiment, the crystal particles constituting the dielectric thin film 13 are crystals having columnar shape, thereby the passage of nitrogen diffusion in the film thickness direction is formed, and thus it is thought that nitrogen can be efficiently taken into the crystal. As a result, the dielectric thin film of the present embodiment attains an improved dielectric constant and high dielectric property.

Further, a constitution ratio of the crystals X having a columnar shape penetrating through such dielectric thin film 13 with respect to the entire crystal particles constituting the dielectric thin film 13 is preferably 30% or more. The above mentioned constitution ratio is a ratio of numbers of the crystals X having the columnar shape penetrating through with respect to entire crystal particles observed based on Transmission Electron Microscope (TEM) image of the dielectric thin film 13. Since the constitution ratio of the crystals X having columnar shape penetrating through is within the above mentioned rage, the dielectric property is improved.

Also, the nitrogen compositions in the dielectric thin film 13 preferably has little fluctuation between positions at ¼ of depth (surface side), ½ of depth (middle of the film), and ¾ of depth (substrate side) from the surface thereof. More preferably, a maximum fluctuation rate of the nitrogen compositions at a position of each depth is preferably within +55%, more preferably within +25%, further preferably ±20%, and particularly preferably ±16%. By having the maximum fluctuation rate of the nitrogen compositions within the above mentioned range, the dielectric property is improved. Note that, the nitrogen compositions of the dielectric thin film 13 can be confirmed by X-ray photoelectron spectroscopy.

The maximum fluctuation rate X is calculated as described in following. First, the nitrogen compositions of five or more different points in the position of each depth are measured. Next, based on the nitrogen compositions of above mentioned five or more different points, the average nitrogen composition at each position of depth is obtained. That is, an average nitrogen composition $X_1$ at the position of ¼ of depth, an average nitrogen composition $X_2$ at the position of ½ of depth, and an average nitrogen composition $X_3$ at the position of ¾ of depth are calculated. Then, $(X_1+X_2+X_3)/3$ which is the average of the nitrogen average composition at the positions of each depth is defined as the average value $X_a$ of the nitrogen composition of the thin film. Further, the fluctuation rate $X_n'=(X_n-X_a)/X_a$ (n=1, 2, 3) at the position of each depth is obtained. That is, the fluctuation rate $X_1'$ at the position of ¼ of depth, the fluctuation rate $X_2'$ at the position of ½ of depth, and the fluctuation rate $X_3'$ at the position of ¾ of depth are calculated. Among $X_1'$, $X_2'$, and $X_3'$, the fluctuation rate having largest difference with respect to the average value $X_a$ is defined as the maximum fluctuation rate.

Regarding the quantification of nitrogen, a nitride single crystal wafer such as AlN or so is preferable, or a sensitivity factor can be calculated from the oxynitride powder constituted from the same composition and the quantified value can be corrected. In case of correcting by the oxynitride powder, the oxynitride powder may be quantified in advance using an impulse heat melting extraction method or so. Also, the internal standard of the X-ray photoelectron spectroscopy apparatus can be used.

The thickness of the dielectric thin film 13 is not particularly limited, but preferably it is 10 nm to 2 μm, and more preferably 10 nm to 1 μm.

The dielectric loss tangent (tan δ) of the dielectric thin film is preferably 60% or less, more preferably 40% or less, further preferably 15% or less, and particularly preferably 10% or less. By having the dielectric loss tangent (tan δ) within the above mentioned range, the dielectric thin film having excellent dielectric property can be obtained.

Note that, the dielectric loss tangent (tan δ) of the dielectric thin film can be measured under a condition of a voltage of 1 V/rms and a frequency of 1 kHz using LCR meter.

The dielectric constant of the dielectric thin film is preferably 355 or more, more preferably 450 or more, further preferably 700 or more, and particularly preferably 1100 or more. By having the dielectric constant within the above mentioned range, the dielectric thin film having excellent dielectric property can be obtained.

Note that, the capacitance is measured under the condition of the voltage of 1 V/rms and the frequency of 1 kHz using LCR meter, then based on the capacitance, the thickness of the dielectric thin film, and the electrode area, the dielectric constant can be calculated.

Production Method of the Thin Film Capacitor 1

Next, the production method of the thin film capacitor 1 will be explained. Hereinafter, the dielectric thin film 13 having the main composition including the oxynitride expressed by the compositional formula of $A_aB_bO_oN_n$ wherein "A" atom is Sr, "B" atom is Ta will be used as an example to explain, in case of using other atoms the same applies.

The film deposition method for forming the thin film as the dielectric thin film 13 at the end is not particularly limited. For example, a vacuum deposition method, a spattering method, PLD method (Pulse Laser Deposition method), MO-CVD method (Metal Organic Chemical Vapor Deposition method), MOD method (Metal Organic Decomposition method), a sol-gel method, and CSD method (Chemical Solution Deposition method) or so may be mentioned. Also, trace amounts of impurities and sub components may be included in the material when depositing the film. It is not a problem as long as an amount of impurities and sub components does not significantly compromise the property of the thin film. Also, the dielectric thin film 13 according to the present embodiment may include trace amounts of impurities and sub components as long as these do not significantly compromise the property.

Among the method of depositing the film, when the film is formed by PLD method, the spattering method, and CSD method or so, the thin film obtained at the end is likely to be a polycrystalline film. It may be made by CVD method, and in case many elements are included, PLD method and the spattering method or so may be used because these methods have higher composition control property. In the present embodiment, the film deposition method using PLD method will be described.

First, Si single crystal substrate as the substrate 11 is prepared. Next, $SiO_2$, $TiO_x$, and Pt are formed in this order on Si single crystal substrate, and the lower electrode 12 made of Pt is formed. The method of forming the lower electrode 12 is not particularly limited. For example, the spattering method and CVD method or so may be mentioned.

Next, the metal oxide thin film is formed on the lower electrode 12 by PLD method. Also, in order to expose part of the lower electrode 12, an area without the thin film is formed using a metal mask.

In PLD method, first, a target including the constituting elements of the polycrystalline dielectric thin film as the object is placed in the film deposition chamber. Next, a pulse laser is irradiated on the surface of the target. Due to the strong energy of the pulse laser, the surface of the target is instantly evaporated. Then, the evaporated substance is deposited on the substrate which is placed by facing towards the target, thereby the metal oxide thin film is formed.

As the target, for example, a precursor having the compositional formula of $A_2B_2O_7$ can be used. This precursor is preferably a perovskite layer form compound wherein a perovskite unit called perovskite slab and an oxygen excess layer are stacked in an alternating manner.

The type of target is not particularly limited, and a pellet formed by compressing the oxynitride powder can be used. Note that, N content included must be strictly regulated, thus the pellet of $A_2B_2O_7$ is used so that better controlling property can be attained. Also, for the target, preferably each element is distributed evenly, but the distribution may be uneven as long as the quality of the obtained dielectric thin film is not affected. Further, the target does not necessarily have to be one, and plurality of targets including part of the constituting elements of the dielectric thin film can be prepared and used for depositing the film. The shape of the target is not particularly limited as well, and the shape may be which is appropriate for the film deposition device being used. By regulating the film deposition condition (a partial pressure of oxygen, and a partial pressure of nitrogen, the size of the film deposition chamber, and the position of the gas introducing tube or so), "a" and "b" of the dielectric thin film obtained at the end can be regulated. For example, by making a/b of the target large, a/b in the formed film can be enlarged as well.

For example, in case the composition of the dielectric thin film obtained at the end is $Sr_aTa_bO_oN_n$, then a sintered body of $Sr_2Ta_2O_7$ is prepared as the target. Further, by regulating the film deposition condition (for example, a partial pressure of oxygen, and a partial pressure of nitrogen, the size of the film deposition chamber, and the position of the gas introducing tube or so), "a" and "b" of the dielectric thin film obtained at the end can be regulated.

The film deposition condition is also important. The metal element evaporated from the target due to a pulse laser is influenced by the elements constituting the atmosphere in the film deposition chamber, and will reach to the film deposition face of the substrate. The characteristic of PLD method is that it allows wide range of the atmospheric pressure from an extra high vacuum to near atmospheric pressure. In PLD method, the film with high crystallinity tends to be easily obtained when the vacuum condition is high, and the film with small defect of oxygen or so tends to be easily obtained when the atmospheric pressure of oxygen or so is higher. When plasma is used together, the pressure range that the plasma can maintain is limited, thus appropriate pressure may be determined based on the crystallinity and defects or so within the range thereof. When introducing oxygen and nitrogen in order to form the film of the oxynitride, oxygen interferes the intake of nitrogen into the film, thus the pressure is preferably low. Even if oxygen is not introduced in, by introducing nitrogen which has been activated by plasma, the perovskite structure can be formed. Note that, for the spattering method, argon is preferably used together as the atmosphere while depositing the film.

Also, for PLD method, when depositing the film, the substrate 11 is preferably heated by an infrared laser in order to crystallize the metal oxide thin film. A heating temperature of the substrate 11 differs depending on the constituting element and the composition or so of the metal oxide thin film and the substrate 11, and for example preferably it is 550 to 850° C., more preferably 600 to 800° C., and further preferably 650 to 750° C. By making the temperature of the substrate within the above mentioned range, the particle having a columnar shape tends to be easily formed. Also, the dielectric property improves because pore is scarcely formed. Further, since the temperature of the substrate 11 has an appropriate temperature, the metal oxynitride thin film tends to easily crystallize, and the cracks generated while cooling can be prevented.

When depositing the film, by carrying out a nitriding treatment by introducing nitrogen radical, the dielectric thin film 13 made of perovskite type oxynitride can be obtained. The nitriding treatment may be done by introducing nitrogen radical after the metal oxide film is formed, but the nitrogen content in the thin film can be further increased by introducing nitrogen radical while depositing the film.

The dielectric thin film 13 on the substrate may be carried out with Rapid Thermal Anneal (RTA) treatment after depositing the film. The upper limit of the temperature at which the annealing can be carried out is 100° C. higher of the film deposition temperature, and more preferably the annealing is carried out at the film deposition temperature or less, thereby the columnar shape structure can be maintained which is formed during the film deposition. When the annealing is carried out at the film deposition temperature or less, XRD pattern of the obtained film will not have a significant difference between before and after the annealing, thus the columnar shape crystal structure is formed when depositing the film; and when annealing is carried out, the compensation of defect and the stress relieving or so are happening.

Lastly, by forming the upper electrode 14 on the dielectric thin film 13, the thin film capacitor 1 can be produced. Note that, the material of the upper electrode 14 is not particularly limited, and Ag, Au, and Cu or so can be used. Also, the method of forming the upper electrode 14 is not particularly limited as well. For example, it can be formed by evaporation and the spattering method or so.

Note that, an intermediate layer 15 may be present between the dielectric thin film 13 and the lower electrode 12, and between the dielectric thin film 13 and the upper electrode 14. The intermediate layer 15 may be constituted by an insulation material, and it may be constituted by a conductive material. As the insulation material, compounds such as oxides or nitrides including at least one selected from the group consisting of aluminum, silicon, strontium, and tantalum or so can be used. As the conductive material, Cu, Al, Ni, Au, and Ni—Cr or so can be used. As the method of forming the intermediate layer 15, the same method as the method of depositing the above mentioned dielectric thin film 13 or the method of forming the lower electrode 12 and the upper electrode 14 can be used. Further, the intermediate layer 15 can function as the layers such as an insulation layer, a stress relieving layer, or a layer to smooth out a roughness of the electrode face or so.

The intermediate layer 15 may be present at both between the dielectric thin film 13 and the lower electrode 12, and between the dielectric thin film 13 and the upper electrode 14, or it may be present at either one. If plurality of intermediate layer is present, each intermediate layer may have different function.

The thickness of the intermediate layer 15 is preferably 20% or less of the thickness of the dielectric thin layer 13, and more preferably 10% or less.

The dielectric thin film according to the present embodiment can be used for example as a voltage tunable capacitor, and a dielectric layer of a high density capacitor device such as a decoupling thin film capacitor or so.

The capacitance element according to the present embodiment is an element using an excellent dielectric property of the dielectric thin film according to the present embodiment, and a capacitor, a thermistor, a filter, a diplexer, a resonator, an emitter, an antenna, a piezoelectric element, a transistor, a ferroelectric memory or so are included. The dielectric thin film according to the present embodiment is suitably used to the capacitance element which requires particularly high dielectric characteristic.

As the method of producing the capacitor as an example of the capacitance element according to the present embodiment, the method of forming a highly tunable device structure having an appropriate electrode on the substrate may be mentioned. The highly tunable device structure is not particularly limited, but for example that integrated with other thin film device such as a SAW duplexer, a switch by RF-MEMS, MEMS air gap varactor of piezoelectric driving type, a fixed (low tunable) high density thin film capacitor, TFBAR circuit, a resistor, a inductor, and TFT having oxides as a base or so may be mentioned.

Hereinabove, the embodiments of the present invention were explained, but the present invention is not to be limited to these embodiments in any way, and the present invention can be carried out in various different embodiments within the scope of the present invention.

EXAMPLE

Hereinafter, the present invention will be described based on further detailed examples, but the present invention is not to be limited thereto.

Example 1

First, as the material of a sintered body of $Sr_2Ta_2O_7$ used as the target for depositing the film, $SrCO_3$ powder and $Ta_2O_5$ powder were prepared. $SrCO_3$ powder and $Ta_2O_5$ powder were weighed so that a mol ratio of Sr/Ta was 1.

Next, $SrCO_3$ powder and $Ta_2O_5$ powder were mixed for 16 hours by a wet ball mill using ethanol solvent, thereby a mixed slurry was obtained.

Next, said mixed slurry was dried at 80° C. for 12 hours using a thermostat drier, and the mixture was obtained.

Next, said mixture was lightly ground in a mortar, and then placed in a ceramic crucible. Then, using an electric furnace, the heat treatment was carried out under an air atmosphere at 1000° C. for 2 hours; thereby the calcined material was obtained.

Next, said calcined material was again mixed for 16 hours by a wet ball mill using ethanol solvent, and then a post-calcination slurry was obtained.

The obtained post-calcination slurry was dried at 80° C. for 12 hours using the thermostat drier, and a post-calcination mixture was obtained.

The post-calcination mixture was added and mixed with the polyvinyl alcohol as the binder, thereby a granule was obtained. The added amount of the polyvinyl alcohol solution was 0.6 wt % with respect to 100 wt % of the ground material.

The granule was molded into a cylindrical columnar shape having a diameter of about 23 mm, and a height of about 9 mm; thereby the molded article was obtained. The molding method was CIP molding.

The molded article was fired under the air atmosphere at 1400° C. for 2 hours using the electric furnace; thereby a sintered article was obtained. Further, a top face and a bottom face of the sintered article was mirror polished, and the target for depositing the film having a height of 5 mm was obtained. Note that, a relative density of the target for depositing the film was 96 to 98%.

The obtained target for depositing the film as mentioned in above was placed to the film deposition device, then Si substrate was placed by facing towards the target for depositing the film. As said Si substrate, those having Pt film as the lower electrode on the surface was used.

In the example 1, the film was formed by irradiating a pulse laser having a frequency of 10 Hz using PLD method so that the thickness was 500 nm. Here, nitrogen was not introduced into the film deposition chamber, and oxygen was only introduced, thereby the dielectric thin film was formed. Also, while depositing the film, plasma was irradiated for 0.5 hours. The film deposition temperature was 700° C. Right after the film was formed, the nitriding treatment was carried out for 30 minutes by introducing nitrogen radical, thereby the dielectric thin film was obtained. The obtained dielectric thin film sample was evaluated as discussed in below.

Evaluation of the Polycrystalline Film and the Alignment Thereof

The obtained sample was subjected to XRD measurement using Intelligent X-ray diffractometer SmartLab made by Rigaku Corporation, thereby, based on XRD pattern confirmed, whether it was an alignment film aligned to specific plane, and also confirmed whether it had polycrystallinity. If polycrystallinity was confirmed and was not the alignment film aligned to specific plane, then it was evaluated as "good"; and if polycrystallinitiy was not confirmed and was the alignment film, then it was evaluated "poor". Also, the composition of oxynitride included in the obtained thin film sample was quantified by photoelectron spectroscopy using PHI Quantera II™ made by ULVAC-PHI, Inc. While carrying out Ar etching, the composition in the depth direction of the thin film was quantified.

Measurement of the Fluctuation Rate of the Nitrogen Composition

For the obtained sample, the nitrogen compositions (atm %) of five different points at the position of ¼ of depth in the thickness direction from the surface of the thin film were measured using X-ray photoelectron spectroscopy, then the average thereof was calculated. Similarly, the nitrogen compositions (atm %) at the position of ½ of depth, and at the position of ¾ of depth in the thickness direction from the surface of the thin film were measured, and each average value was calculated. The maximum fluctuation rate was calculated from these average values. The results are shown in Table 1.

Evaluation of the Columnar Shape Crystal and the Presence of Pore

Figure 3:
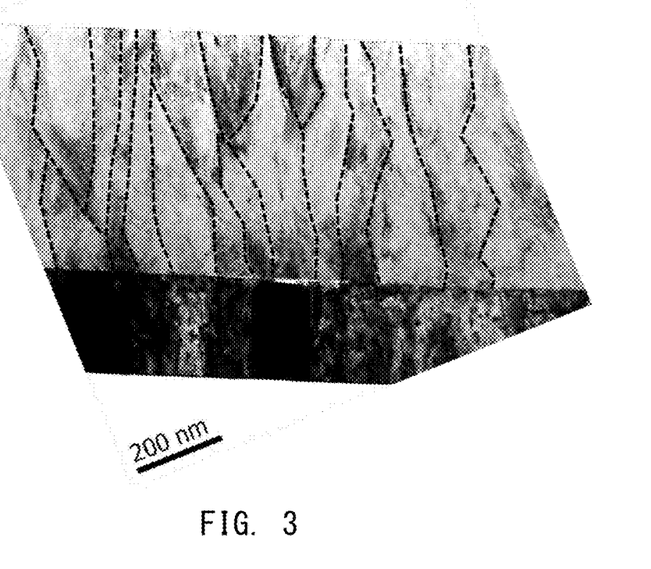
FIG. 3 is TEM image of a dielectric thin film sample of the example 1. The broken line shows the shape of the particle.

For the obtained sample, the cross section of the thin film was observed using a scanning electron microscope (SEM). The presence of pore having the size of 30 nm or more was searched in SEM image for three observation fields which each field of vision was 1.2 μm×1.5 μm. Also, using TEM image obtained using the transmission electron microscope (TEM), the presence of the crystals having columnar shape were verified. Further, when the crystals having columnar shape were confirmed, then it was verified whether the crystals having columnar shape were extending in the direction crossing with the substrate. Then, the ratio of the columnar shape crystals penetrating through was calculated based on TEM image. The results are shown in Table 1. Further, TEM image obtained in the example 1 is shown in FIG. 3.

Measurement of the Dielectric Property (Tan δ and the Dielectric Constant)

The capacitance and tan δ of the sample were measured under the condition of the voltage of 1 V/rms and the frequency of 1 kHz using LCR meter. Then, the dielectric constant was calculated based on the thickness of the thin film, the electrode area, and the capacitance.

Crystal Structure

The crystal structure of the obtained sample was verified from XRD measurement.

Example 2

Figure 4:
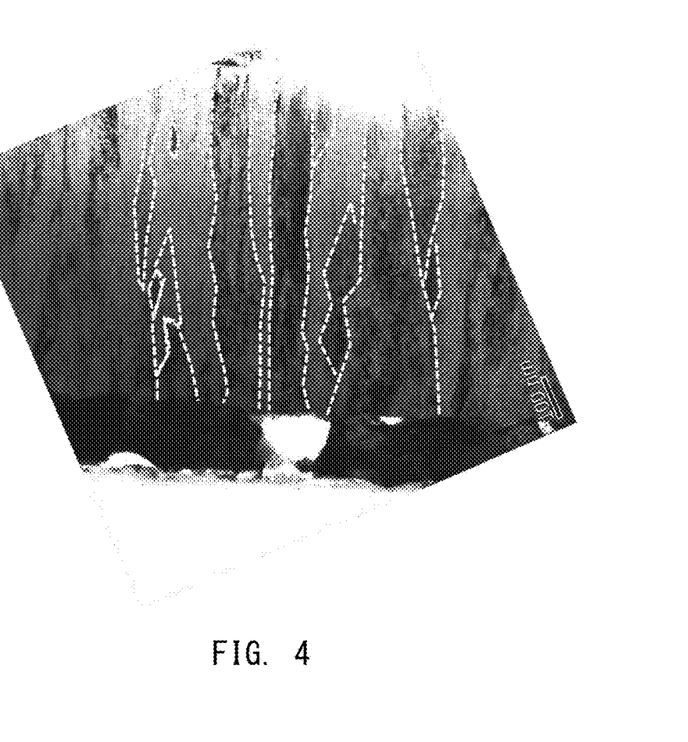
FIG. 4 is TEM image of a dielectric thin film sample of the example 2. The broken line shows the shape of the particle.

In the example 2, the dielectric oxide film was formed so that the thickness was 1000 nm using PLD method. Also, when depositing the film, the nitriding treatment was carried out by introducing nitrogen radical, and nitrogen radical was not introduced after the film was formed. Other conditions were same as the example 1, and the dielectric thin film was obtained. The evaluation was carried out as same as the example 1. The results are shown in Table 1. Also, TEM image is shown in FIG. 4.

Example 3

In the example 3, the dielectric oxide film was formed so that the thickness was 500 nm using PLD method. The film deposition temperature was 600° C. Other conditions were same as the example 1, and the dielectric thin film sample was obtained. The evaluation was carried out as same as the example 1. The results are shown in Table 1.

Example 4

The dielectric thin film sample was obtained as same as the example 1 except for the following. That is, in the example 4, $La_2O_3$ powder and $TiO_2$ powder were prepared as the material of the sintered body of $La_2Ti_2O_7$ which was used as the film deposition target. $La_2O_3$ powder and $TiO_2$ powder were weighed so that the mol ratio La/Ti was 1. Also, the dielectric oxide film was formed so that the thickness was 500 nm using PLD method. The evaluation was carried out as same as the example 1. The results are shown in Table 1.

Example 5

The dielectric thin film sample was obtained as same as the example 1 except for the following. That is, in the example 5, $BaCO_3$ powder and $Ta_2O_5$ powder were prepared as the material of the sintered body of the oxide of which the mol ratio Ba/Ta of 1 used as the film deposition target. $BaCO_3$ powder and $Ta_2O_5$ powder were weighed so that the mol ratio Ba/Ta was 1. Also, the dielectric oxide film as formed so that the thickness was 500 nm using PLD method. Since $Ba_2Ta_2O_7$ does not exist, even if the target sintered body is regulated so that the mol ratio Ba/Ta satisfies 1, depending on the film deposition condition, the mol ratio of the obtained thin film is scarcely transferred to the target composition. Thus, the partial pressure during the film deposition was regulated, and for the sample attained the mol ratio Ba/Ta of 1, the same evaluation as the example 1 was carried out. The results are shown in Table 1.

Example 6

In the example 6, the dielectric thin film sample was obtained as same as the example 1 except that the film deposition temperature was 500° C. The evaluation was carried out as same as the example 1. The results are shown in Table 1.

Example 7

In the example 7, the dielectric thin film sample was obtained as same as the example 1 except that the film deposition temperature was 850° C. The evaluation was carried out as same as the example 1. The results are shown in Table 1.

Comparative Example 1

In the comparative example 1, the dielectric thin film sample was obtained as same as the example 2 except that the film depositing temperature was 400° C. The evaluation was carried out as same as the example 1. The results are shown in Table 1.

Comparative Example 2

In the comparative example 2, the dielectric thin film sample was obtained as same as the example 2 except that the film deposition temperature was 300° C. The evaluation was carried out as same as the example 1. The results are shown in Table 1.

Comparative Example 3

In the comparative example 3, the dielectric thin film sample was obtained as same as the example 2 except that the film deposition temperature was 900° C. The evaluation was carried out as same as the example 1. The results are shown in Table 1.

TABLE 1

| | Composition | Pore | Columnar shape crystal | Polycrystallinity | Crystal structure | N composition (atm %) | | | Max fluctuation rate |
| --- | --- | --- | --- | --- | --- | --- | --- | --- | --- |
| | | | | | | Surface side | Middle of film | Electrode side | |
| Example 1 | SrTaO2N | None | Present | Good | Perovskite slub structure | 1.0 | 1.0 | 1.1 | 6% |
| Example 2 | SrTaO2N | None | Present | Good | Perovskite structure | 4.2 | 5.1 | 5.4 | −14% |
| Example 3 | SrTaO2N | None | Present | Good | Perovskite structure | 3.8 | 4.0 | 4.2 | −8% |
| Example 4 | LaTiO2N | None | Present | Good | Perovskite structure | 9.9 | 10.0 | 8.9 | −7% |
| Example 5 | BaTaO2N | None | Present | Good | Perovskite structure | 7.8 | 8.4 | 6.3 | −16% |
| Comparative example 1 | SrTaO2N | Present | None | Good | Perovskite structure | — | — | — | — |
| Comparative example 2 | SrTaO2N | None | None (Amorphous) | Poor | — | — | — | — | — |
| Comparative example 3 | SrTaO2N | None | None | Good | Perovskite structure | 1.0 | 0.1 | 0.1 | 150% |
| Example 6 | SrTaO2N | None | Present | Good | Perovskite structure | 2.1 | 1.9 | 0.7 | −55% |
| Example 7 | SrTaO2N | None | Present | Good | Perovskite structure | 4.8 | 4.1 | 1.6 | −54% |

| | Number of entire columnar shape crystals | Number of columnar shape crystals penetrating through | Penetrating ratio | Dielectric constant | tan δ (%) |
| --- | --- | --- | --- | --- | --- |
| Example 1 | 15 | 8 | 53% | 1004 | 1 |
| Example 2 | 18 | 8 | 44% | 2980 | 5 |
| Example 3 | 22 | 8 | 36% | 1280 | 8 |
| Example 4 | 17 | 9 | 53% | 1620 | 10 |
| Example 5 | 19 | 8 | 42% | 1354 | 8 |
| Comparative example 1 | unable to measure | unable to measure | unable to measure | 420 | 63 |
| Comparative example 2 | unable to measure | unable to measure | unable to measure | 337 | 82 |
| Comparative example 3 | unable to measure | unable to measure | unable to measure | 332 | 200 |
| Example 6 | 25 | 5 | 20% | 455 | 42 |
| Example 7 | 18 | 5 | 28% | 357 | 60 |

According to Table 1, and TEM images of FIG. 3 and FIG. 4, for the examples 1 to 7, the dielectric thin film sample was obtained which was constituted by polycrystalline without pore and constituted by the columnar shape crystals which were extending in the direction crossing with the substrate; and the maximum fluctuation rate of N composition was ±55% or less and this was even in the film thickness direction. On the other hand, for the dielectric thin film sample of the comparative example 1, pore was confirmed, and the columnar shape crystals were not confirmed. For the dielectric thin film sample of the comparative example 2, pore was not confirmed, but the crystal structure was not confirmed, and also the columnar shape crystals were not confirmed. Also, for the comparative examples 1 and 2, nitrogen was not detected. For the dielectric thin film sample of the comparative example 3, the columnar shape crystals were not confirmed, and the maximum fluctuation rate of N composition was larger than ±55%.

Example 8

In the example 8, the dielectric thin film sample was obtained as same as the example 1 except that plasma was irradiated for longer time when depositing the film. The evaluation was carried out as same as the example 1. The results are shown in Table 2. Note that, for the crystal structure, the result was "no peak shift" in comparison to the example 1. The meaning of "no peak shift" is that the peak position of pattern obtained by X-ray diffraction is not shifted, and regardless of how nitrogen N is included, the size of the crystal lattice has not changed compared to the example 1.

Example 9

In the example 9, the dielectric thin film sample was obtained as same as the example 1 except that plasma was irradiated for even longer time when depositing the film. The evaluation was carried out as same as the example 1. The results are shown in Table 2. Note that, for the crystal structure, as similar to the example 8, the result was "no peak shift" in comparison to the example 1.

Examples 10 and 11

In the examples 10 and 11, the dielectric thin film sample was obtained as same as the example 1 except that the frequency of the pulse laser was changed and the film deposition condition was changed. The evaluation was carried out as same as the example 1. The results are shown in Table 2. Note that, for the crystal structure, the result was "no peak shift" in comparison to the example 2. That is, for the examples 10 and 11, regardless of how nitrogen N is included; the size of the crystal lattice not changed compared to the example 2.

TABLE 2

| | Composition | Pore | Columnar shape crystal | Polycrystallinity | Crystal structure | N composition (atm %) | | | Max fluctuation rate | Dielectric constant | tan δ (%) |
| --- | --- | --- | --- | --- | --- | --- | --- | --- | --- | --- | --- |
| | | | | | | Surface side | middle of film | Electrode side | | | |
| Example 1 | SrTaO2N | None | Present | Good | Perovskite slab structure | 1.0 | 1.0 | 1.1 | 6% | 1004 | 1 |
| Example 8 | SrTaO2N | None | Present | Good | Perovskite slab structure (no peak shift) | 1.5 | 1.1 | 1.0 | 25% | 680 | 22 |
| Example 9 | SrTaO2N | None | Present | Good | Perovskite slab structure (no peak shift) | 2.1 | 1.6 | 1.4 | 24% | 575 | 25 |
| Example 2 | SrTaO2N | None | Present | Good | Perovskite structure | 4.2 | 5.1 | 5.4 | −14% | 2980 | 5 |
| Example 10 | SrTaO2N | None | Present | Good | Perovskite structure (no peak shift) | 3.7 | 4.0 | 5.3 | 22% | 977 | 37 |
| Example 11 | SrTaO2N | None | Present | Good | Perovskite structure (no peak shift) | 3.6 | 4.3 | 5.4 | 22% | 1108 | 17 |

NUMERICAL REFERENCE

1 . . . Thin film capacitor
11 . . . Substrate
12 . . . Lower electrode
13 . . . Dielectric thin film
14 . . . Upper electrode
15 . . . Intermediate layer
X . . . Columnar shape crystal

The invention claimed is:

1. A capacitance element comprising a dielectric thin film comprising a main component comprised of an oxynitride expressed by a compositional formula of $A_a B_b O_o N_n$ (a+b+o+n=5),
wherein the "A" is one or more selected from the group consisting of Sr, Ba, Ca, La, Ce, Pr, Nd, and Na,
the "B" is one or more selected from the group consisting of Ta, Nb, Ti, and W, and
crystalline particles constituting said dielectric thin film are polycrystalline which are not oriented to a particular crystal plane orientation, and further the crystalline particles comprises columnar shape crystals.

2. The capacitance element according to claim 1, wherein the columnar shape crystals extend to a direction crossing with a substrate of which the dielectric thin film is formed.

3. The capacitance element according to claim 2, wherein a constituting ratio by count of said columnar shape crystals extending entirely from one surface to a rear face of the dielectric thin film are 30% or more.

4. The capacitance element according to claim 1, wherein a fluctuation rate calculated from compositional ratios of nitrogen at a position of ¼ of depth, ½ of depth, and ¾ of depth from the surface of the dielectric thin film in a thickness direction are within maximum of ±55%.

5. The capacitance element according to claim 1, wherein the "A" is Sr, the "B" is at least one of Ta and Nb, and the "n" is larger than 0 and smaller than 1.

* * * * *